United States Patent
Saito et al.

(10) Patent No.: US 10,922,182 B2
(45) Date of Patent: Feb. 16, 2021

(54) MOTOR DRIVING DEVICE AND DETERMINATION METHOD

(71) Applicant: FANUC CORPORATION, Yamanashi (JP)

(72) Inventors: Sou Saito, Yamanashi-ken (JP); Tsutomu Shikagawa, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 86 days.

(21) Appl. No.: 16/258,935

(22) Filed: Jan. 28, 2019

(65) Prior Publication Data
US 2019/0235960 A1 Aug. 1, 2019

(30) Foreign Application Priority Data
Jan. 29, 2018 (JP) ................ 2018-012173

(51) Int. Cl.
*H02P 3/18* (2006.01)
*G06F 11/14* (2006.01)
(Continued)

(52) U.S. Cl.
CPC .... *G06F 11/1441* (2013.01); *G01R 19/16528* (2013.01); *G06F 12/16* (2013.01); *H02M 5/4585* (2013.01); *H02P 27/06* (2013.01); *H02P 29/024* (2013.01); *H02P 29/025* (2013.01); *H02M 1/32* (2013.01); *H02M 2001/0012* (2013.01)

(58) Field of Classification Search
CPC .... H02M 1/32; H02M 2001/322; H02M 1/08; H02M 1/36; H02M 1/425
See application file for complete search history.

(56) References Cited

U.S. PATENT DOCUMENTS

2013/0033110 A1* 2/2013 Sun ................ H02M 1/36
307/64
2014/0015432 A1* 1/2014 Otake ............... H02M 1/425
315/206

FOREIGN PATENT DOCUMENTS

CN 101729018 A 6/2010
CN 102983802 A 3/2013
(Continued)

OTHER PUBLICATIONS

English Abstract and Machine for Japanese Publication No. 10-243675 A, published Sep. 11, 1998, 8 pgs.
(Continued)

*Primary Examiner* — Alesa Allgood
(74) *Attorney, Agent, or Firm* — Fredrikson & Byron, P.A.

(57) ABSTRACT

A motor driving device includes: a rectifier circuit for rectifying an AC input voltage supplied from an AC power supply to a DC voltage; a smoothing capacitor for smoothing the rectified DC voltage; a relay that outputs a contact signal when the input voltage is input to the rectifier circuit from the AC power supply; an input voltage detector for detecting the input voltage; a capacitor voltage detector for detecting the capacitor voltage; a volatile first storage; a nonvolatile second storage; and a backup start determiner for determining whether or not to start a backup operation of transferring the information stored in the first storage to the second storage, based on at least one of the contact signal, the input voltage and the capacitor voltage.

10 Claims, 2 Drawing Sheets

(51) Int. Cl.
  *H02P 27/06* (2006.01)
  *G06F 12/16* (2006.01)
  *H02M 5/458* (2006.01)
  *G01R 19/165* (2006.01)
  *H02P 29/024* (2016.01)
  *H02M 1/00* (2006.01)
  *H02M 1/32* (2007.01)

(56) References Cited

FOREIGN PATENT DOCUMENTS

| | | | |
|---|---|---|---|
| CN | 106100456 | A | 11/2016 |
| DE | 102014225398 | A1 | 6/2015 |
| JP | 7132189 | A | 5/1995 |
| JP | 10243675 | A | 9/1998 |
| JP | 20018496 | A | 1/2001 |
| JP | 2001268988 | A | 9/2001 |
| JP | 2007222828 | A | 9/2007 |
| JP | 200811621 | A | 1/2008 |
| JP | 2008209018 | A | 9/2008 |
| JP | 2009148139 | A | 7/2009 |
| JP | 2013198958 | A | 10/2013 |
| JP | 2014207735 | A | 10/2014 |
| JP | 2015164376 | A | 9/2015 |
| JP | 201663705 | A | 4/2016 |

OTHER PUBLICATIONS

English Abstract and Machine Translation for Japanese Publication No. 2013-198958 A, published Oct. 3, 2013, 7 pgs.
English Abstract and Machine Translation for Japanese Publication No. 2001-008496 A, published Jan. 12, 2001, 6 pgs.
English Abstract and Machine Translation for Japanese Publication No. 2015-164376 A, published Sep. 10, 2015, 27 pgs.
English Abstract and Machine Translation for Japanese Publication No. 2007-222828 A, published Sep. 6, 2007, 7 pgs.
English Abstract and Machine Translation for Japanese Publication No. 2001-268988 A, published Sep. 28, 2001, 9 pgs.
English Abstract and Machine Translation for Japanese Publication No. 2008-209018 A, published Sep. 11, 2008, 8 pgs.
English Abstract and Machine Translation for Japanese Publication No. 2008-011621 A, published Jan. 17, 2008, 9 pgs.
English Abstract and Machine Translation for Japanese Publication No. 2014-207735 A, published Oct. 30, 2014, 14 pgs.
English Abstract and Machine Translation for Japanese Publication No. 2016-063705 A, published Apr. 25, 2016, 8 pgs.
English Abstract and Machine Translation for Japanese Publication No. 2009-148139 A, published Jul. 2, 2009, 13 pgs.
English Abstract and Machine Translation for Japanese Publication No. H07-132189 A, published May 23, 1995, 5 pgs.
English Machine Translation of Decision to Grant a Patent mailed by Japan Patent Office (JPO) for Application No. JP2018-012173, dated Feb. 4, 2020, 2 pages.
Untranslated Decision to Grant a Patent mailed by Japan Patent Office (JPO) for Application No. JP2018-012173, dated Feb. 4, 2020, 3 pages.
English Machine Translation of Notification of Reasons for Refusal mailed by Japan Patent Office (JPO) for Application No. JP2018-012173, dated Nov. 26, 2019, 6 pages.
Untranslated Notification of Reasons for Refusal mailed by Japan Patent Office (JPO) for Application No. JP2018-012173, dated Nov. 26, 2019, 6 pages.
English Abstract and Machine Translation for Chinese Publication No. CN101729018A, published Jun. 9, 2010, 17 pgs.
English Abstract and Machine Translation for Chinese Publication No. CN102983802A, published Mar. 20, 2013, 6 pgs.
English Abstract and Machine Translation for Chinese Publication No. CN106100456A, published Nov. 9, 2016, 14 pgs.
English Abstract and Machine Translation for German Publication No. DE102014225398A1, published Jun. 18, 2015, 14 pgs.
E. Dold & Sohne KG, Datenblatt Installations-/Uberwachungstechnik [data sheet installation /monitoring technology], Varimeter Phasenwachter [phase guard] IK 9169, RK 9169, SK 9169, D-78114 Furtwangen, Firmenschrift, 2016, with English translation of German Office Action dated Dec. 16, 2020 for corresponding German Application No. 102019000560.0 showing relevance of document, 8 pgs.

\* cited by examiner

MOTOR DRIVING DEVICE AND DETERMINATION METHOD

CROSS-REFERENCE TO RELATED APPLICATION

This application is based upon and claims the benefit of priority from Japanese Patent Application No. 2018-012173 filed on Jan. 29, 2018, the contents of which are incorporated herein by reference.

BACKGROUND OF THE INVENTION

Field of the Invention

The present invention relates to a motor driving device and a determination method for determining the start of a backup operation for transferring information stored in a volatile storage to a nonvolatile storage.

Description of the Related Art

In the motor driving device, when power failure occurs, the data stored in the volatile memory is erased. To deal with this, when a power failure is detected, it is necessary to back up the data stored in the volatile memory into the nonvolatile memory. For this purpose, the motor driving device has a capacitor as a backup power source for the nonvolatile memory. This capacitor supplies voltage to the nonvolatile memory only during the backup operation.

As a related art, Japanese Laid-Open Patent Publication No. 2015-164376 discloses a system for detecting power failure based on a contact signal at an auxiliary contact. That is, in Japanese Laid-Open Patent Publication No. 2015-164376, it is determined that power failure has occurred when a contact signal is not transmitted.

SUMMARY OF THE INVENTION

However, since the auxiliary contact (relay) has a mechanical structure, the time from when a power failure occurs until the contact signal stops being output fluctuates. Therefore, the capacitance of the capacitor must be increased in consideration of the fluctuation, so that it is necessary to provide a capacitor having an excessively large capacitance, which results in the need of a large mounting area for the capacitor as well as an increased cost.

It is therefore an object of the present invention to provide a motor driving device and a determination method for suppressing variation of the time period from the occurrence of a power failure until it is determined to start a backup operation.

According to a first aspect of the present invention, a motor driving device for driving a motor includes: a rectifier circuit configured to rectify an AC input voltage supplied from an AC power supply to a DC voltage; a smoothing capacitor configured to smooth the DC voltage rectified by the rectifier circuit; an inverter configured to convert a capacitor voltage across the smoothing capacitor into an AC voltage to drive the motor; a relay configured to be turned on and output a contact signal when the input voltage is input to the rectifier circuit from the AC power supply; an input voltage detector configured to detect the input voltage; a capacitor voltage detector configured to detect the capacitor voltage; a volatile first storage; a nonvolatile second storage; and a backup start determiner configured to determine whether or not to start a backup operation of transferring the information stored in the first storage to the second storage, based on at least one of the contact signal output from the relay, the input voltage, and the capacitor voltage.

According to a second aspect of the present invention, a determination method for use in a motor driving device having a volatile first storage and a nonvolatile second storage to determine start of a backup operation of transferring information stored in the first storage to the second storage, wherein the motor driving device includes: a rectifier circuit configured to rectify an AC input voltage supplied from an AC power supply to a DC voltage; a smoothing capacitor configured to smooth the DC voltage rectified by the rectifier circuit; an inverter configured to convert a capacitor voltage across the smoothing capacitor into an AC voltage to drive the motor; and a relay configured to be turned on and output a contact signal when the input voltage is input to the rectifier circuit from the AC power supply. The determination method includes: an input voltage detecting step of detecting the input voltage; a capacitor voltage detecting step of detecting the capacitor voltage; and a backup start determining step of determining whether or not to start the backup operation, based on at least one of the contact signal output from the relay, the input voltage, and the capacitor voltage.

According to the present invention, it is possible to suppress variations in time from the occurrence of a power failure until the determination of starting the backup operation. Therefore, since the capacity of the backup capacitor as the backup power supply can be suppressed, the mounting area of the backup capacitor can be reduced, and so can the cost.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

The motor driving device and the determination method according to the present invention will be detailed hereinbelow by describing preferred embodiments with reference to the accompanying drawings.

EMBODIMENT

Figure 1:
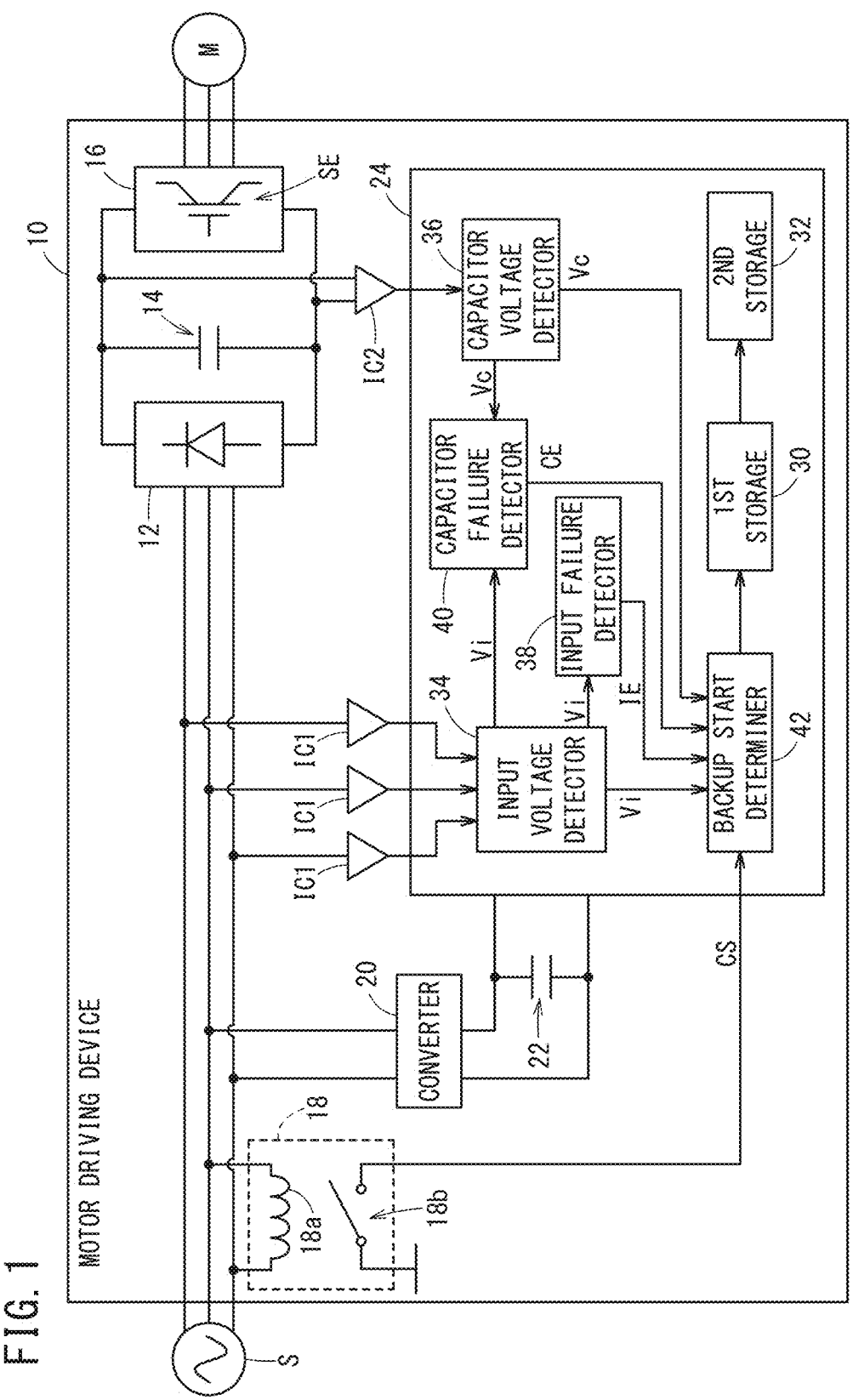
FIG. 1 is a configuration diagram of a motor driving device that drives a motor using an AC power supply.

FIG. 1 is a configuration diagram of a motor driving device 10 that drives a motor M using an AC power supply S. The motor driving device 10 includes a rectifier circuit 12, a smoothing capacitor 14, an inverter 16, a relay 18, a converter 20, a backup capacitor 22, and a control unit 24.

The rectifier circuit 12 rectifies an AC input voltage Vi supplied from the AC power supply S into a DC voltage. In the present embodiment, because the AC power supply S supplies three-phase AC input voltage Vi (for example, Vi 100 V), the rectifier circuit 12 rectifies the three-phase input voltage Vi to a DC voltage. The smoothing capacitor 14 smooths the DC voltage rectified by the rectifier circuit 12.

Here, the rectifier circuit 12 may include, for example, a switching element so as to rectify the input voltage Vi to a DC voltage by switching operation of the switching elements. In this case, the rectifier circuit 12 may have a switch that performs a switching operation under the control of the control unit 24, or may have a switch that shuts off the supply of the input voltage Vi to the rectifier circuit 12, arranged between the AC power supply S and the rectifier circuit 12. This switch is turned on/off under the control of the control unit 24. When the switching operation is not performed and when the supply of the input voltage Vi to the rectifier circuit 12 is cut off, the rectifier circuit 12 is in a state of not being driven. Therefore, Vc, the voltage across the smoothing capacitor 14, becomes approximately 0 V.

The inverter 16 converts the DC voltage (the voltage across the smoothing capacitor 14) Vc smoothed by the smoothing capacitor 14 into an AC voltage to drive the motor M. The inverter 16 includes a plurality of switching elements SE. The inverter 16 converts the voltage Vc across the smoothing capacitor 14 (hereinafter referred to as a capacitor voltage) into an AC voltage by switching the multiple switching elements SE to drive the motor M. The multiple switching elements SE of the inverter 16 are switched under the control of the control unit 24.

When the input voltage Vi is input from the AC power supply S to the rectifier circuit 12, the relay 18 is turned on and outputs a contact signal CS. The relay 18 is a mechanical relay having a coil 18a and a switch 18b. The coil 18a is arranged between the AC power supply S and the rectifier circuit 12. As the input voltage Vi is supplied from the AC power supply S to the rectifier circuit 12, current flows through the coil 18a. As the current flows through the coil 18a, magnetic force is generated to turn on the switch 18b. When the switch 18b is turned on, the contact signal CS is output to the control unit 24.

The converter 20 converts the input voltage Vi into a DC voltage (DC secondary voltage) necessary to drive the control unit 24 (for example, 24 V). The DC voltage converted by the converter 20 is supplied to the control unit 24.

Provided between the converter 20 and the control unit 24 is a backup capacitor 22 as a backup power supply. The backup capacitor 22 is charged by the DC voltage converted by the converter 20 and is used as a backup power source for the control unit 24.

The control unit 24 controls the driving of the rectifier circuit 12 and the inverter 16 and performs backup operation when power failure has occurred. The control unit 24 includes a first storage 30, a second storage 32, an input voltage detector 34, a capacitor voltage detector 36, an input failure detector 38, a capacitor failure detector 40, and a backup start determiner 42. Here, the backup operation refers to an operation of transferring the information stored in the volatile first storage 30 to the nonvolatile second storage 32.

Since the first storage 30 is volatile, when the power supply from the AC power supply S is interrupted and the electric power stored in the backup capacitor 22 runs out, the stored information cannot be retained. The first storage 30 may store information necessary for the motor driving device 10 to drive the motor M and may be used as a buffer memory. The first storage 30 may include a DRAM (Dynamic Random Access Memory), for example.

Since the second storage 32 is nonvolatile, even if the power supply from the AC power supply S is cut off and the electric power stored in the backup capacitor 22 runs out, the second storage can hold the stored information. The second storage 32 may be a volatile memory with a backup power supply that supplies voltage to the volatile memory. The second storage 32 may include an SRAM (Static Random Access Memory), for example.

The input voltage detector 34 detects the input voltage Vi that is input from the AC power supply S to the rectifier circuit 12. Here, since the input voltage Vi is of three phases, the input voltage detector 34 detects the input voltage Vi for each phase. The input voltage detector 34 outputs the detected input voltage Vi to the input failure detector 38, the capacitor failure detector 40, and the backup start determiner 42. Here, the input voltage detector 34 receives input signals corresponding to three phases of input voltage Vi via respective insulation circuits IC1.

The capacitor voltage detector 36 detects the capacitor voltage Vc. The capacitor voltage detector 36 outputs the detected capacitor voltage Vc to the capacitor failure detector 40 and the backup start determiner 42. Here, the capacitor voltage detector 36 receives an input signal corresponding to the capacitor voltage Vc via an insulation circuit IC2.

The input failure detector 38 detects a failure of the input voltage detector 34. The input failure detector 38 determines whether or not the detection of the input voltage detector 34 is abnormal. When the detection is abnormal, the input failure detector 38 determines that the input voltage detector 34 is faulty. Here, the input voltage Vi is a sinusoidal wave which changes over time. In the case of a power failure, the input voltage Vi takes a value around 0 V. Therefore, when the input voltage Vi detected by the input voltage detector 34 is greater than a predetermined value (e.g., 10 V) and has not changed for a fixed period of time, the input failure detector 38 determines that the input voltage detector 34 is faulty. When detecting the failure of the input voltage detector 34, the input failure detector 38 outputs an input failure signal IE as an indication of the failure of the input voltage detector 34 to the backup start determiner 42.

The capacitor failure detector 40 detects a failure of the capacitor voltage detector 36. The capacitor failure detector 40 determines whether or not the detection of the capacitor voltage detector 36 is abnormal. When the detection is abnormal, the capacitor failure detector 40 determines that the capacitor voltage detector 36 is faulty. Here, the peak value of the input voltage Vi and the capacitor voltage Vc coincide with each other within a predetermined range. Therefore, if the peak value of the input voltage Vi and the capacitor voltage Vc are apart beyond a predetermined range for a certain period of time, the capacitor failure detector 40 determines that the capacitor voltage detector 36 is faulty. The reason why the aforementioned certain period of time is provided is that the peak value of the input voltage Vi and the capacitor voltage Vc may become apart beyond the predetermined range in some cases due to the operation of the motor M. When detecting a failure of the capacitor voltage detector 36, the capacitor failure detector 40 outputs a capacitor failure signal CE indicating a failure of the capacitor voltage detector 36 to the backup start determiner 42.

The backup start determiner 42, based on at least one of the contact signal CS, the input voltage Vi, and the capacitor voltage Vc, determines whether to start a backup operation. Specifically, the backup start determiner 42 determines whether or not a power failure has happened based on at least one of the contact signal CS, the input voltage Vi, and the capacitor voltage Vc. Then, when a power failure is confirmed, the backup start determiner 42 determines that a backup operation is started. Upon determining that the backup operation is to be started, the backup start determiner 42 outputs a backup command to the first storage 30, whereby the backup operation of transferring the information stored in the first storage 30 to the second storage 32 is started.

Here, when a power failure occurs, the relay 18 is turned off, so that the input of the contact signal CS to the control unit 24 is interrupted. Further, when a power failure occurs, the input voltage Vi, and the capacitor voltage Vc lower. However, since there are variations in the time from the occurrence of a power failure up to when the contact signal CS stops being output, power failure detection based on the contact signal CS lacks temporal stability. In contrast, power failure detection based on the input voltage Vi and the capacitor voltage Vc has temporal stability, so there is not much time variation from the occurrence of a power failure to the detection thereof.

Therefore, in the embodiment, in principle, the backup start determiner 42 generally determines occurrence of a power failure when the input voltage Vi lowers and the capacitor voltage Vc lowers, and determines that the backup operation is started. Since the input voltage Vi and the capacitor voltage Vc are used to determine the occurrence of a power failure, it is possible to detect a power failure with high accuracy.

However, since the capacitor voltage Vc is approximately 0 V when the rectifier circuit 12 is not driven, it is impossible to detect a power failure based on the capacitor voltage Vc. In a case where the capacitor voltage detector 36 is out of order, it is also impossible to detect a power failure based on the capacitor voltage Vc. In such cases, when the input voltage Vi lowers, the backup start determiner 42 determines that the backup operation is started. Thus, it is possible to detect a power failure even when the rectifier circuit 12 is not driven or when the capacitor voltage detector 36 is out of order.

The input voltage Vi is sinusoidal, changing over time. Therefore, when the effective value or the peak value of the input voltage Vi lowers, when the input voltage Vi remains lower than the predetermined value even after a lapse of the predetermined period of time, or when the input voltage Vi has not increased even after a lapse of the predetermined period of time, the backup start determiner 42 determines that the input voltage Vi has lowered. That is, it is determined that the input voltage Vi has lowered due to power failure.

Further, when the rectifier circuit 12 is not driven or the capacitor voltage detector 36 is faulty, and when the input voltage detector 34 is also faulty, it is impossible to detect a power failure based on the input voltage Vi and the capacitor voltage Vc. Therefore, in this case, the backup start determiner 42, judging that the relay 18 is turned off based on the contact signal CS (when the contact signal CS is not sent), determines to start the backup operation.

In the case where the rectifier circuit 12 is driven and the capacitor voltage detector 36 is not in failure, if the input voltage detector 34 has failed, it is impossible to detect a power failure using the input voltage Vi. Therefore, in this case, when the capacitor voltage Vc lowers, the backup start determiner 42 determines that the backup operation is started.

Next, the determination operation of the backup start determiner 42 will be described with reference to the flowchart shown in FIG. 2. It is assumed that the input voltage detector 34, the capacitor voltage detector 36, the input failure detector 38, and the capacitor failure detector 40 repeat voltage detection and failure detection cyclically at intervals of a predetermined period. The predetermined period is equal to or shorter than the time for performing one round of the operation shown in FIG. 2.

First, at step S1, the backup start determiner 42 determines whether or not the rectifier circuit 12 is being driven.

When determining that the rectifier circuit 12 is being driven at step S1, the backup start determiner 42 determines whether or not the capacitor voltage detector 36 is faulty at step S2. When the capacitor failure signal CE is sent from the capacitor failure detector 40, the backup start determiner 42 determines that the capacitor voltage detector 36 is faulty.

When determining at step S2 that the capacitor voltage detector 36 has not failed, the backup start determiner 42 determines at step S3 whether or not the input voltage detector 34 is faulty. When the input failure signal IE is sent from the input failure detector 38, the backup start determiner 42 determines that the input voltage detector 34 is faulty.

When determining that the input voltage detector 34 has not failed at step S3, the backup start determiner 42 determines at step S4 whether or not the input voltage Vi has lowered and whether or not the capacitor voltage Vc has lowered.

When determining at step S4 that the input voltage Vi has lowered and the capacitor voltage Vc has lowered, the backup start determiner 42 determines that a power failure has occurred and determines at step S9 that the backup operation is started.

In this way, since both the input voltage Vi and the capacitor voltage Vc are used, it is possible to accurately detect a power failure. In addition, since power failure detection based on the input voltage Vi and the capacitor voltage Vc can offer temporal stability, it is possible to suppress variations in time from the occurrence of a power failure until determination of starting the backup operation. Thus, since the capacity of the backup capacitor 22 can be suppressed, the mounting area of the backup capacitor 22 can be reduced, and so can the cost.

When it is determined at step S9 that the backup operation is to be started, the backup start determiner 42 starts the backup operation. That is, the backup start determiner 42 outputs a backup command to the first storage 30. As a result, the backup operation of transferring the information stored in the first storage 30 to the second storage 32 starts.

On the other hand, when the backup start determiner 42 determines at step S4 that at least one of the input voltage Vi and the capacitor voltage Vc is not lowered, the control returns to step S1, and the above-described steps are repeated. That is, when determining at step S4 that the input voltage Vi has lowered whereas the capacitor voltage Vc has not been lowered, the backup start determiner 42 determines that no power failure is occurring and determines not to start the backup operation.

On the other hand, when it is determined that the rectifier circuit 12 is not driven at step S1 and if it is determined at step S2 that the capacitor voltage detector 36 is faulty, the control goes to step S5.

At step S5, the backup start determiner 42 determines whether or not the input voltage detector 34 is faulty. The determination at step S5 is the same as that at step S3.

When determining that the input voltage detector 34 has not failed at step S5, the backup start determiner 42 determines whether the input voltage Vi has lowered at step S6.

When it is determined at step S6 that the input voltage Vi has lowered, the backup start determiner 42 determines that a power failure has occurred and that the backup operation is started at step S9.

In this way, the input voltage Vi is used when the rectifier circuit 12 is not driven and when the capacitor voltage detector 36 is faulty, so that it is possible to detect a power failure and determine the start of the backup operation. Further, since power failure detection based on the input voltage Vi has temporal stability, it is possible to suppress variations in time from the occurrence of a power failure until determination of starting the backup operation. Therefore, the capacity of the backup capacitor 22 can be suppressed, hence the mounting area of the backup capacitor 22 can be reduced, and so can the cost.

On the other hand, when the backup start determiner 42 determines at step S6 that the input voltage Vi has not lowered, the control returns to step S1 and the above-described steps are repeated. That is, when determining at step S6 that the input voltage Vi has not lowered, the backup start determiner 42 determines that no power failure is occurring and determines that the backup operation is not started.

When determining at step S5 that the input voltage detector 34 is faulty, the backup start determiner 42 determines at step S7 whether or not the supply of the contact signal CS has been cut off. That is, the backup start determiner 42 determines whether or not the contact signal CS is no longer sent from the relay 18.

When determining at step S7 that the supply of the contact signal CS has been stopped, the backup start determiner 42 determines that the relay 18 has been turned off due to the occurrence of a power failure and that the backup operation is started at step S9.

In this way, when the rectifier circuit 12 is not driven or the capacitor voltage detector 36 has failed, and the input voltage detector 34 has failed, the contact signal CS is used. Therefore, it is possible to detect a power failure and determine the start of the backup operation.

On the other hand, when determining at step S7 that the supply of the contact signal CS has not been stopped, the backup start determiner 42 returns to step S1 and the above-described steps are repeated. That is, when determining at step S7 that the supply of the contact signal CS has not been cut off, the backup start determiner 42 determines that no power failure is occurring and determines that the backup operation is not started.

When determining at step S3 that the input voltage detector 34 is faulty, the backup start determiner 42 determines at step S8 whether or not the capacitor voltage Vc has lowered.

When determining at step S8 that the capacitor voltage Vc has lowered, the backup start determiner 42 determines that a power failure has occurred and determines at step S9 that the backup operation is started.

In this way, when the input voltage detector 34 has failed with the rectifier circuit 12 correctly driven and the capacitor voltage detector 36 not failed, the capacitor voltage Vc is used so that it is possible to detect a power failure and determine the start of the backup operation. Further, since power failure detection based on the capacitor voltage Vc has temporal stability, it is possible to suppress variations in time from the occurrence of a power failure until determination of starting the backup operation. Therefore, the capacity of the backup capacitor 22 can be suppressed, hence the mounting area of the backup capacitor 22 can be reduced, and so can the cost.

On the other hand, when determining at step S8 that the capacitor voltage Vc has not lowered, the backup start determiner 42 returns to step S1 and the above-described steps are repeated. That is, when determining at step S8 that the capacitor voltage Vc has not lowered, the backup start determiner 42 determines that no power failure is occurring and the backup operation is not started.

Variational Example

Figure 2:
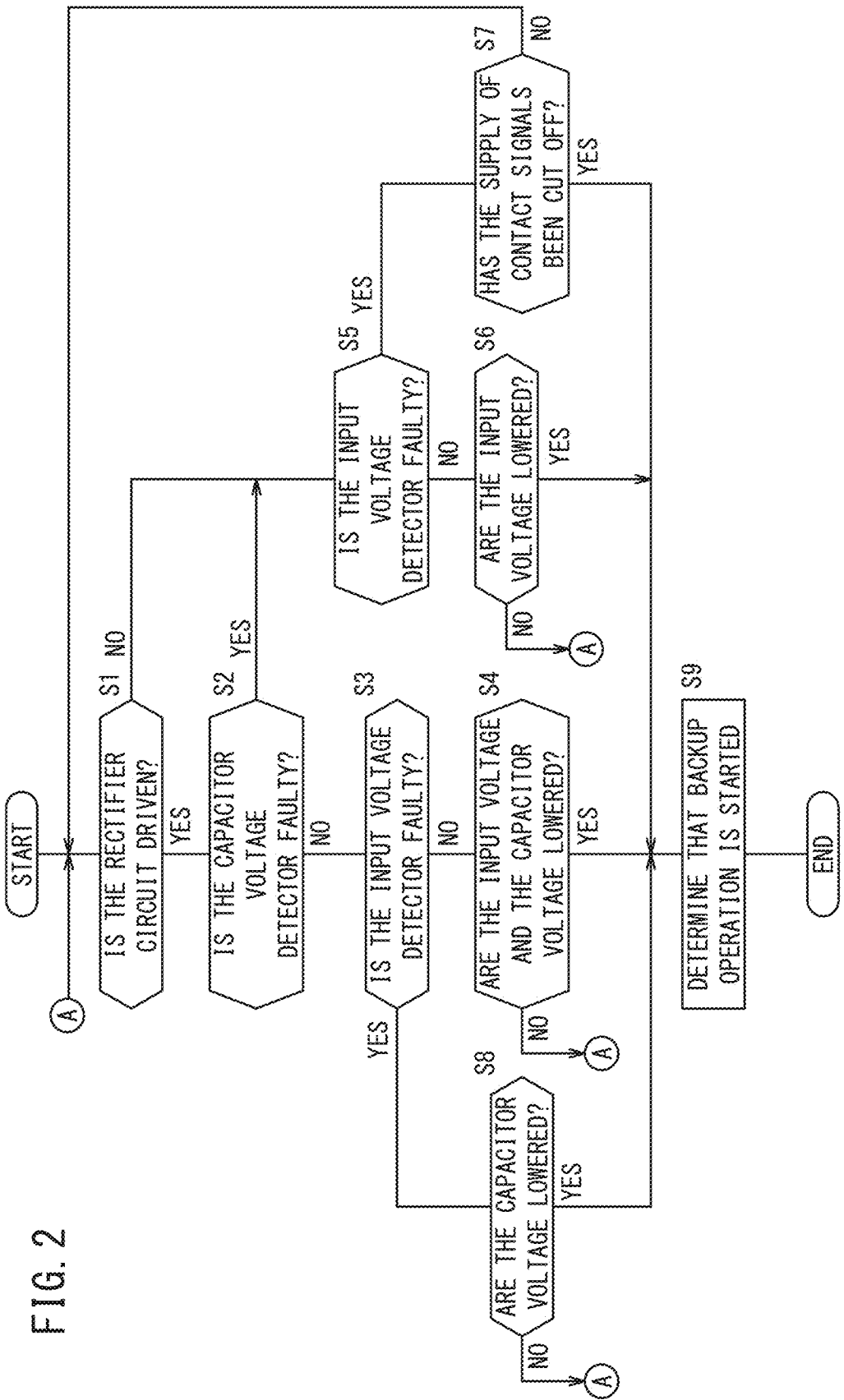
FIG. 2 is a flowchart showing a determination operation of the backup start determiner shown in FIG. 1.

Though, at step S4 in FIG. 2, the backup start determiner 42 determines whether or not the input voltage Vi has lowered and whether or not the capacitor voltage Vc has lowered, it is possible to determine whether only one of them, either the input voltage Vi or the capacitor voltage Vc, has lowered. In this case, if it is determined at step S4 that at least one of the input voltage Vi and the capacitor voltage Vc has lowered, the control proceeds to step S9. If it is determined at step S4 that neither the input voltage Vi nor the capacitor voltage Vc has lowered, the control returns to step S1. That is, the backup start determiner 42 determines that the rectifier circuit 12 is driven and that the input voltage detector 34 and the capacitor voltage detector 36 have not failed (YES at step S1, NO at steps S2 and S3). When it is determined that at least one of the input voltage Vi and the capacitor voltage Vc has lowered (YES at step S4 of the variational example), the backup start determiner 42 determines that a power failure has occurred and determines that the backup operation at step S9 is started.

Technical Idea Obtained From Embodiment

Technical ideas that can be grasped from the above embodiment and variational example are described below.

First Technical Idea

A motor driving device (10) for driving a motor (M) includes: a rectifier circuit (12) configured to rectify an AC input voltage (Vi) supplied from an AC power supply (S) to a DC voltage; a smoothing capacitor (14) configured to smooth the DC voltage rectified by the rectifier circuit (12); an inverter (16) configured to convert a capacitor voltage (Vc) across the smoothing capacitor (14) into an AC voltage to drive the motor (M); a relay (18) configured to be turned on and output a contact signal (CS) when the input voltage (Vi) is input to the rectifier circuit (12) from the AC power supply (S); an input voltage detector (34) configured to detect the input voltage (Vi); a capacitor voltage detector (36) configured to detect the capacitor voltage (Vc); a volatile first storage (30); a nonvolatile second storage (32); and a backup start determiner (42) configured to determine whether or not to start a backup operation of transferring the information stored in the first storage (30) to the second storage (32), based on at least one of the contact signal (CS) output from the relay (18), the input voltage (Vi), and the capacitor voltage (Vc).

Thereby, it is possible to suppress variations in time from the occurrence of a power failure until determination of starting the backup operation. Therefore, the capacity of the backup capacitor (22) as the backup power supply can be suppressed, hence the mounting area of the backup capacitor (22) can be reduced, so can the cost.

The backup start determiner (42) may be configured to determine to start the backup operation when at least one of the input voltage (Vi) and the capacitor voltage (Vc) has lowered. Since power failure detection based on the input voltage (Vi) and the capacitor voltage (Vc) has temporal stability, it is possible to suppress variations in time from the occurrence of a power failure until determination of starting the backup operation. Therefore, the capacity of the backup capacitor (22) can be suppressed, hence the mounting area of the backup capacitor (22) can be reduced, and so can the cost.

The backup start determiner (42) may be configured to determine to start the backup operation when both the input voltage (Vi) and the capacitor voltage (Vc) have lowered. Since power failure detection based on the input voltage (Vi) and the capacitor voltage (Vc) has temporal stability, it is possible to suppress variations in time from the occurrence of a power failure until determination of starting the backup operation. Therefore, the capacity of the backup capacitor (22) can be suppressed, hence the mounting area of the backup capacitor (22) can be reduced, and so can the cost.

The backup start determiner (42) may be configured to determine to start the backup operation when the input voltage (Vi) has lowered, if the rectifier circuit (12) is not being driven. As a result, even when the rectifier circuit (12) is not driven, it is possible to detect a power failure and determine the start of the backup operation. Further, since power failure detection based on the input voltage (Vi) and the capacitor voltage (Vc) has temporal stability, it is possible to suppress variations in time from the occurrence of a power failure until determination of starting the backup operation. Therefore, the capacity of the backup capacitor (22) can be suppressed, hence the mounting area of the backup capacitor (22) can be reduced, and so can the cost.

The motor driving device (10) may further include a capacitor failure detector (40) configured to detect a failure of the capacitor voltage detector (36). The backup start determiner (42) may be configured to determine to start the backup operation when the input voltage (Vi) has lowered, if a failure of the capacitor voltage detector (36) has been detected by the capacitor failure detector (40). As a result, even when the capacitor voltage detector (36) is faulty, it is possible to detect a power failure and determine the start of the backup operation. Further, since power failure detection based on the input voltage (Vi) and the capacitor voltage (Vc) has temporal stability, it is possible to suppress variations in time from the occurrence of a power failure until determination of starting the backup operation. Therefore, since the capacity of the backup capacitor (22) can be suppressed, the mounting area of the backup capacitor (22) can be reduced, and so can the cost.

The motor driving device (10) may further include an input failure detector (38) configured to detect a failure of the input voltage detector (34). The backup start determiner (42) may be configured to determine to start the backup operation when determining that the relay (18) has been turned off based on the contact signal (CS), if a failure of the input voltage detector (34) has been detected by the input failure detector (38). As a result, even if the input voltage detector (34) is faulty, it is possible to detect a power failure and determine the start of the backup operation.

The motor driving device (10) may further include an input failure detector (38) configured to detect whether or not the input voltage detector (34) is faulty. The backup start determiner (42) may be configured to determine to start the backup operation when the capacitor voltage (Vc) has lowered, if a failure of the input voltage detector (34) has been detected by the input failure detector (38). As a result, even if the input voltage detector (34) is faulty, it is possible to detect a power failure and determine the start of the backup operation. In addition, since power failure detection based on the capacitor voltage (Vc) has temporal stability, it is possible to suppress variations in time from the occurrence of a power failure until determination of starting the backup operation. Therefore, since the capacity of the backup capacitor (22) can be suppressed, the mounting area of the backup capacitor (22) can be reduced, and so can the cost.

Second Technical Idea

A determination method enables a motor driving device (10) having a volatile first storage (30) and a nonvolatile second storage (32) to determine start of a backup operation of transferring information stored in the first storage (30) to the second storage (32). The motor driving device (10) includes: a rectifier circuit (12) configured to rectify an AC input voltage (Vi) supplied from an AC power supply (S) to a DC voltage; a smoothing capacitor (14) configured to smooth the DC voltage rectified by the rectifier circuit (12); an inverter (16) configured to convert a capacitor voltage (Vc) across the smoothing capacitor (14) into an AC voltage to drive the motor (M); and a relay (18) configured to be turned on and output a contact signal (CS) when the input voltage (Vi) is input to the rectifier circuit (12) from the AC power supply (S). The determination method includes: an input voltage detecting step of detecting the input voltage (Vi); a capacitor voltage detecting step of detecting the capacitor voltage (Vc); and a backup start determining step of determining whether or not to start the backup operation, based on at least one of the contact signal (CS) output from the relay (18), the input voltage (Vi), and the capacitor voltage (Vc).

Thereby, it is possible to suppress variations in time from the occurrence of a power failure until determination of starting the backup operation. Therefore, since the capacity of the backup capacitor (22) as the backup power supply can be suppressed, the mounting area of the backup capacitor (22) can be reduced, so can the cost.

The backup start determining step may determine to start the backup operation when at least one of the input voltage (Vi) and the capacitor voltage (Vc) has lowered. Since power failure detection based on the input voltage (Vi) and the capacitor voltage (Vc) has temporal stability, it is possible to suppress variations in time from the occurrence of a power failure until determination of starting the backup operation. Therefore, the capacity of the backup capacitor (22) can be suppressed, hence the mounting area of the backup capacitor (22) can be reduced, and so can the cost.

The backup start determining step may determine to start the backup operation when both the input voltage (Vi) and the capacitor voltage (Vc) have lowered. Since power failure detection based on the input voltage (Vi) and the capacitor voltage (Vc) has temporal stability, it is possible to suppress variations in time from the occurrence of a power failure until determination of starting the backup operation. Therefore, the capacity of the backup capacitor (22) can be suppressed, hence the mounting area of the backup capacitor (22) can be reduced, and so can the cost.

The backup start determining step may determine to start the backup operation when the input voltage (Vi) has lowered, if the rectifier circuit (12) is not being driven. As a result, even when the rectifier circuit (12) is not driven, it is possible to detect a power failure and determine the start of the backup operation. Further, since power failure detection based on the input voltage (Vi) and the capacitor voltage (Vc) has temporal stability, it is possible to suppress variations in time from the occurrence of a power failure until determination of starting the backup operation. Therefore, the capacity of the backup capacitor (22) can be suppressed, hence the mounting area of the backup capacitor (22) can be reduced, and so can the cost.

The determination method may further include a capacitor abnormality determining step of determining whether or not the detection by the capacitor voltage detecting step is abnormal. The backup start determining step may determine to start the backup operation when the input voltage (Vi) has lowered, if the detection by the capacitor voltage detecting step has been determined to be abnormal. As a result, even when the detection of the capacitor voltage (Vc) is abnormal, it is possible to detect a power failure and determine the start of the backup operation. Further, since power failure detection based on the input voltage (Vi) and the capacitor voltage (Vc) has temporal stability, it is possible to suppress variations in time from the occurrence of a power failure until determination of starting the backup operation. Therefore, since the capacity of the backup capacitor (22) can be suppressed, the mounting area of the backup capacitor (22) can be reduced, and so can the cost.

The determination method may further include an input abnormality determining step of determining whether or not the detection by the input voltage detecting step is abnormal. The backup start determining step may determine to start the backup operation when determining that the relay (18) has been turned off based on the contact signal (CS), if the detection by the input voltage detecting step has been determined to be abnormal. Thereby, even when the detection of the input voltage (Vi) is abnormal, it is possible to detect a power failure and determine the start of the backup operation.

The determination method may further include an input abnormality determining step of determining whether or not the detection by the input voltage detecting step is abnormal. The backup start determining step may determine to start the backup operation when the capacitor voltage (Vc) has lowered, if the detection by the input voltage detecting step has been determined to be abnormal. As a result, even when the detection of the input voltage (Vi) is abnormal, it is possible to detect a power failure and determine the start of the backup operation. Further, since power failure detection based on the input voltage (Vi) and the capacitor voltage (Vc) has temporal stability, it is possible to suppress variations in time from the occurrence of a power failure until determination of starting the backup operation. Therefore, since the capacity of the backup capacitor (22) can be suppressed, the mounting area of the backup capacitor (22) can be reduced, and so can the cost.

The present invention is not limited to the above-described embodiment, and various modifications can be made without departing from the gist of the present invention.

What is claimed is:

1. A motor driving device for driving a motor, comprising:
    a rectifier circuit configured to rectify an AC input voltage supplied from an AC power supply to a DC voltage;
    a smoothing capacitor configured to smooth the DC voltage rectified by the rectifier circuit;
    an inverter configured to convert a capacitor voltage across the smoothing capacitor into an AC voltage to drive the motor;
    a relay configured to be turned on and output a contact signal when the input voltage is input to the rectifier circuit from the AC power supply;
    a controller programmed to perform the following steps:
    an input voltage detecting step of detecting the input voltage;
    a capacitor voltage detecting step of detecting the capacitor voltage; and
    a backup start determining step of determining whether or not to start a backup operation of transferring the information stored in a first storage to a second storage, based on at least one of the contact signal output from the relay, the input voltage, and the capacitor voltage,
    wherein the backup start determining step determines whether the rectifier circuit is being driven,
    when the rectifier circuit is being driven,
        the backup start determining step determines to start the backup operation when both the input voltage and the capacitor voltage have lowered,
    when the rectifier circuit is not being driven,
        the backup start determining step determines to start the backup operation when the input voltage has lowered.

2. The motor driving device according to claim 1, wherein the controller is further programmed to perform an input failure detecting step of detecting a failure of the input voltage detecting step of detecting the input voltage, wherein the backup start determining step determines to start the backup operation when determining that the relay has been turned off based on the contact signal, if a failure of the input voltage detecting step has been detected.

3. The motor driving device according to claim 1, wherein the controller is further programmed to perform an input failure detector detecting step detecting whether or not the input voltage detecting step of detecting the input voltage is faulty, wherein the backup start determining step determines to start the backup operation when the capacitor voltage has lowered, if a failure of the input voltage detecting step has been detected.

4. The motor driving device according to claim 1, wherein the controller is further programmed to perform a capacitor failure detecting step of detecting a failure of the capacitor voltage detection step of detecting the capacitor voltage, wherein the backup start determining step determines to start the backup operation when the input voltage has lowered, if a failure of the capacitor voltage detecting step has been detected.

5. The motor driving device according to claim 4, wherein the controller is further programmed to perform an input failure detecting step of detecting a failure of the input voltage detecting step of detecting the input voltage, wherein the backup start determining step determines to start the backup operation when determining that the relay has been turned off based on the contact signal, if a failure of the input voltage detecting step has been detected.

6. A determination method for use in a motor driving device having a volatile first storage and a nonvolatile second storage to determine start of a backup operation of transferring information stored in the first storage to the second storage, wherein the motor driving device includes:
    a rectifier circuit configured to rectify an AC input voltage supplied from an AC power supply to a DC voltage;
    a smoothing capacitor configured to smooth the DC voltage rectified by the rectifier circuit;
    an inverter configured to convert a capacitor voltage across the smoothing capacitor into an AC voltage to drive the motor; and
    a relay configured to be turned on and output a contact signal when the input voltage is input to the rectifier circuit from the AC power supply,
    the determination method comprising:
    an input voltage detecting step of detecting the input voltage;
    a capacitor voltage detecting step of detecting the capacitor voltage; and
    a backup start determining step of determining whether or not to start the backup operation, based on at least one of the contact signal output from the relay, the input voltage, and the capacitor voltage, wherein the backup start determining step determines whether the rectifier circuit is being driven, when the rectifier circuit is being driven,
the backup start determining step determines to start the backup operation when both the input voltage and the capacitor voltage have lowered, when the rectifier circuit is not being driven,
the backup start determining step determines to start the backup operation when the input voltage has lowered.

7. The determination method according to claim 6, further comprising an input abnormality determining step of determining whether or not the detection by the input voltage detection step is abnormal, wherein the backup start determining step determines to start the backup operation when determining that the relay has been turned off based on the contact signal, if the detection by the input voltage detecting step has been determined to be abnormal.

8. The determination method according to claim 6, further comprising an input abnormality determining step of determining whether or not the detection by the input voltage detection step is abnormal, wherein the backup start determining step determines to start the backup operation when the capacitor voltage has lowered, if the detection by the input voltage detecting step has been determined to be abnormal.

9. The determination method according to claim 6, further comprising a capacitor abnormality determining step of determining whether or not the detection by the capacitor voltage detecting step is abnormal, wherein the backup start determining step determines to start the backup operation when the input voltage has lowered, if the detection by the capacitor voltage detecting step has been determined to be abnormal.

10. The determination method according to claim 9, further comprising an input abnormality determining step of determining whether or not the detection by the input voltage detection step is abnormal, wherein the backup start determining step determines to start the backup operation when determining that the relay has been turned off based on the contact signal, if the detection by the input voltage detecting step has been determined to be abnormal.

* * * * *